(12) United States Patent
Lee et al.

(10) Patent No.: US 6,181,636 B1
(45) Date of Patent: Jan. 30, 2001

(54) OUTPUT LINE ARRANGEMENT STRUCTURE OF ROW DECODING ARRAY

(75) Inventors: Byung Jae Lee, Ichon; Yang Kyu Lim, Seoul, both of (KR)

(73) Assignee: Hyundai Electronics Industries Co., Ltd., Ichon (KR)

( * ) Notice: Under 35 U.S.C. 154(b), the term of this patent shall be extended for 0 days.

(21) Appl. No.: 09/475,026

(22) Filed: Dec. 30, 1999

(30) Foreign Application Priority Data

Dec. 30, 1998 (KR) .................................................. 98-61973

(51) Int. Cl.[7] ........................................................ G11C 8/00
(52) U.S. Cl. ................................ 365/230.06; 365/230.03; 365/63
(58) Field of Search ........................ 365/230.06, 230.03, 365/51, 63

(56) References Cited

U.S. PATENT DOCUMENTS

| | | |
|---|---|---|
| 4,797,858 | 1/1989 | Wang et al. . |
| 5,089,992 | 2/1992 | Shinohara . |
| 5,253,203 | 10/1993 | Partovi et al. . |
| 5,280,443 | 1/1994 | Hidaka et al. . |
| 5,367,488 | 11/1994 | An . |
| 5,461,589 | 10/1995 | Hidaka et al. . |
| 5,473,566 | 12/1995 | Rao . |
| 5,561,623 | 10/1996 | Ema . |
| 5,652,723 | 7/1997 | Dosaka et al. . |
| 5,689,473 | 11/1997 | Toda . |
| 5,703,821 | 12/1997 | Baroni et al. . |
| 5,717,645 | 2/1998 | Kengeri et al. . |
| 5,798,978 | 8/1998 | Yoo et al. . |
| 5,825,704 | 10/1998 | Shau . |
| 5,889,724 | * 3/1999 | Khang et al. ............... 365/230.06 X |

* cited by examiner

Primary Examiner—Huan Hoang
(74) Attorney, Agent, or Firm—Jacobson, Price, Holman & Stern, PLLC

(57) ABSTRACT

The present invention relates to an output line arrangement structure of a row decoding array used to determine a word line address of a plurality of memory cell arrays in a semiconductor memory device. The present invention can decrease an area when arranging the memory array, and can implement a high speed operation according to load reduction of a word line control signal, by arranging a part of output lines at one side end portion of a memory array, and another part thereof at the middle portion of the memory array (bit line divider), in a bus structure of word line enable and disable signals used for the row decoding array (main word line and sub-word line array constitution).

2 Claims, 3 Drawing Sheets

OUTPUT LINE ARRANGEMENT STRUCTURE OF ROW DECODING ARRAY

BACKGROUND OF THE INVENTION

1. Field of the Invention

The present invention relates to arrangement of bus lines transmitting a signal used to determine a word line address of a plurality of memory cell arrays of a semiconductor memory device, and in particular to an output line (bus) arrangement structure of a row decoding array.

2. Description of the Background Art

An output signal of a row decoding array is a word line enable signal Pxi and a word line disable signal /Pxi. In general, a high voltage and an inside voltage are employed as an operational voltage, respectively at enable and disable states. A functional block of receiving the two signals, and connecting them to a final word line is a sub-word line driver (SWD).

As illustrated in FIG. 1, a conventional output line (bus) arrangement structure of the row decoding array is controlled according to the word line enable signal Pxi and the word line disable signal /Pxi applied from a word line driver 17 to an output line 15 of the row decoding array in order to drive a cell block 11 including: a unit memory array 12 consisting of a plurality of sub-memory cell arrays 10 and a plurality of sub-word line drivers 13; and a main row decoder 14 connected to one end portion of the unit memory array 12, and selects a final word line CWL<0> by the sub-word line driver 13.

Here, each unit memory array 12 employs one output line 15 of the row decoding array. At the same time, a unit bit sense amp 16 consisting of a plurality of bit sense amps is positioned below the output line 15 of the row decoding array. In addition, when a row address of 2 bits is used for decoding the word line driver 17, as shown in FIG. 1, four unit memory arrays 12, four word line drivers 17 and four output lines of the row decoding array are used.

However, in the conventional output line arrangement structure for the row decoding array, one word line driver 17 must control the four unit memory arrays 12, and thus a delay corresponding to four times of a unit memory array word line transmission speed is generated. As a result, a high speed operation is difficult to perform. In addition, the output line 15 of the row decoder array is arranged at every unit bit sense amp 16, and thus an area for line arrangement is increased by four times.

SUMMARY OF THE INVENTION

Accordingly, it is an object of the present invention to provide an output line arrangement structure of a row decoding array which can decrease an area when arranging a memory array, and implement a high speed operation according to load reduction of a word line control signal, by arranging a part of output lines at one side end portion of a cell array, and another part of the output lines at a middle portion of the cell array (bit line divider), in a bus structure of word line enable and disable signals used for the row decoding array.

In order to achieve the above-described object of the present invention, there is provided an output line arrangement structure of a row decoding array wherein a part of output lines of the row decoding array controls a unit memory array sub-word line driver at upper and lower ends through a bit line divider, another part thereof controls a unit memory array sub-word line driver through one side end unit bit sense amp, thereby selecting a final word line, in a unit memory array consisting of a plurality of memory cells.

Here, the output line of the row decoding array controls at least two unit memory arrays.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

An output line arrangement structure of a row decoding array in accordance with a preferred embodiment of the present invention will now be described in detail with reference to the accompanying drawings.

Figure 1:
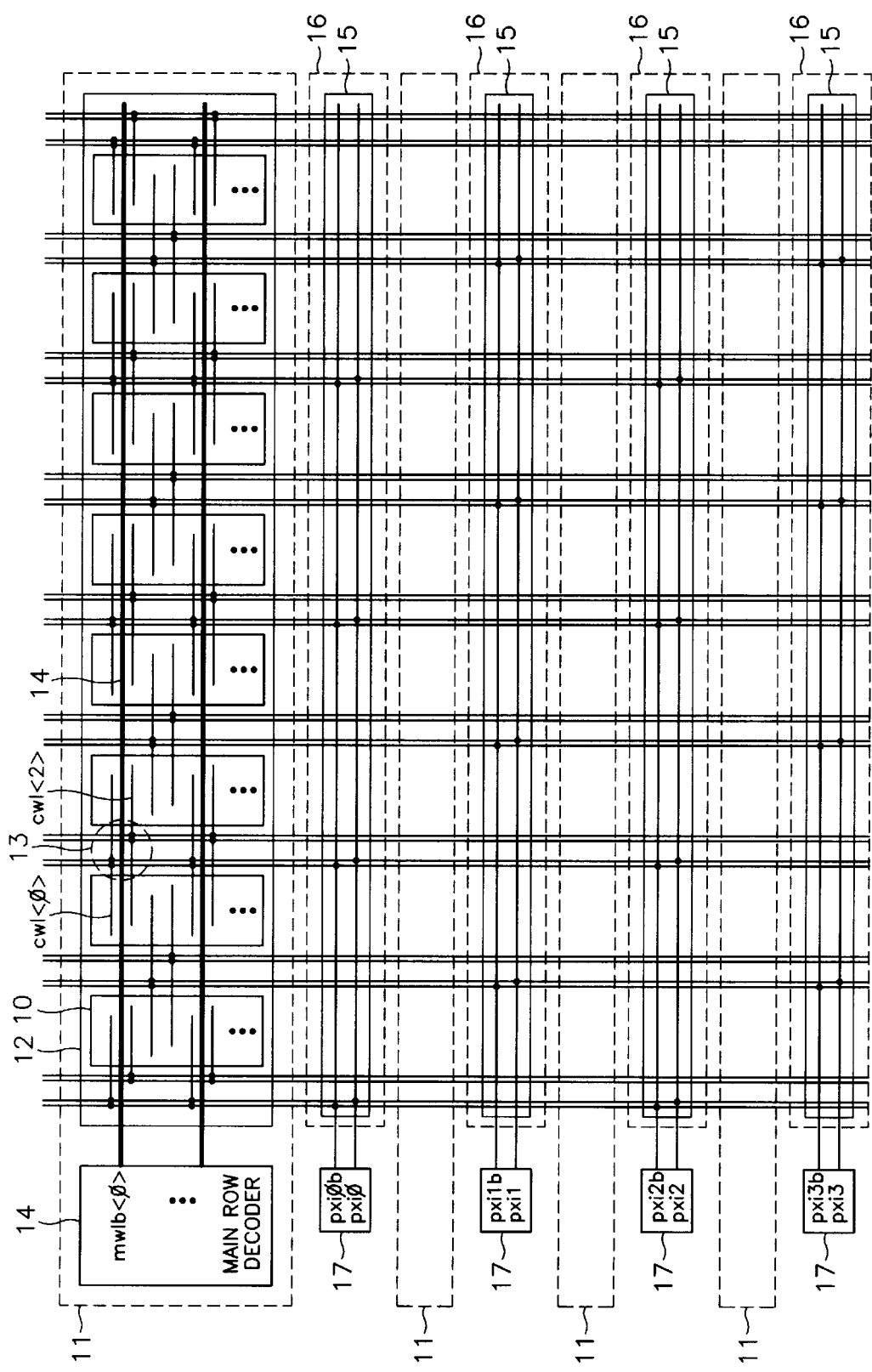
FIG. 1 illustrates a conventional output line arrangement structure of a row decoding array.
Figure 2:
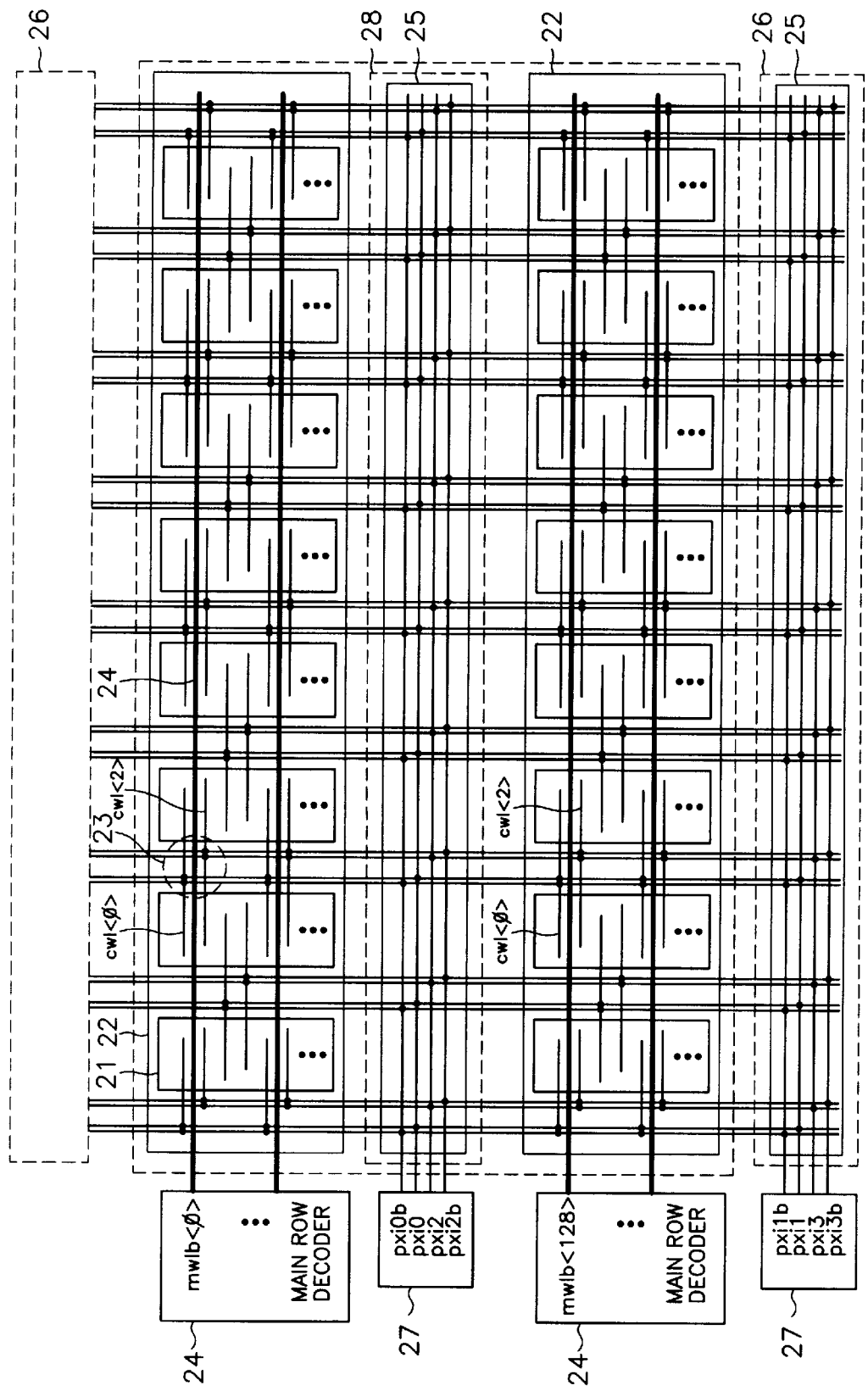
FIG. 2 illustrates an output line arrangement structure of a row decoding array in accordance with a preferred embodiment of the present invention.

FIG. 2 illustrates the output line arrangement structure of the row decoding array in accordance with the present invention. As shown therein, the output line arrangement structure of the row decoding array has a repeated structure of a unit bit sense amp 26, a unit memory array 22 consisting of a plurality of sub-memory cell arrays 21 and a plurality of sub-word line drivers (SWD) 23, a bit line divider 28, the unit memory array 22 and the unit bit sense amp 26; and a repeated structure of a main row decoder 24 connected to one side end portion of the repeated structure, for driving a main word line of the unit memory array 22, a word line driver 27, the main row decoder 24 and the word line driver 27.

Figure 3:
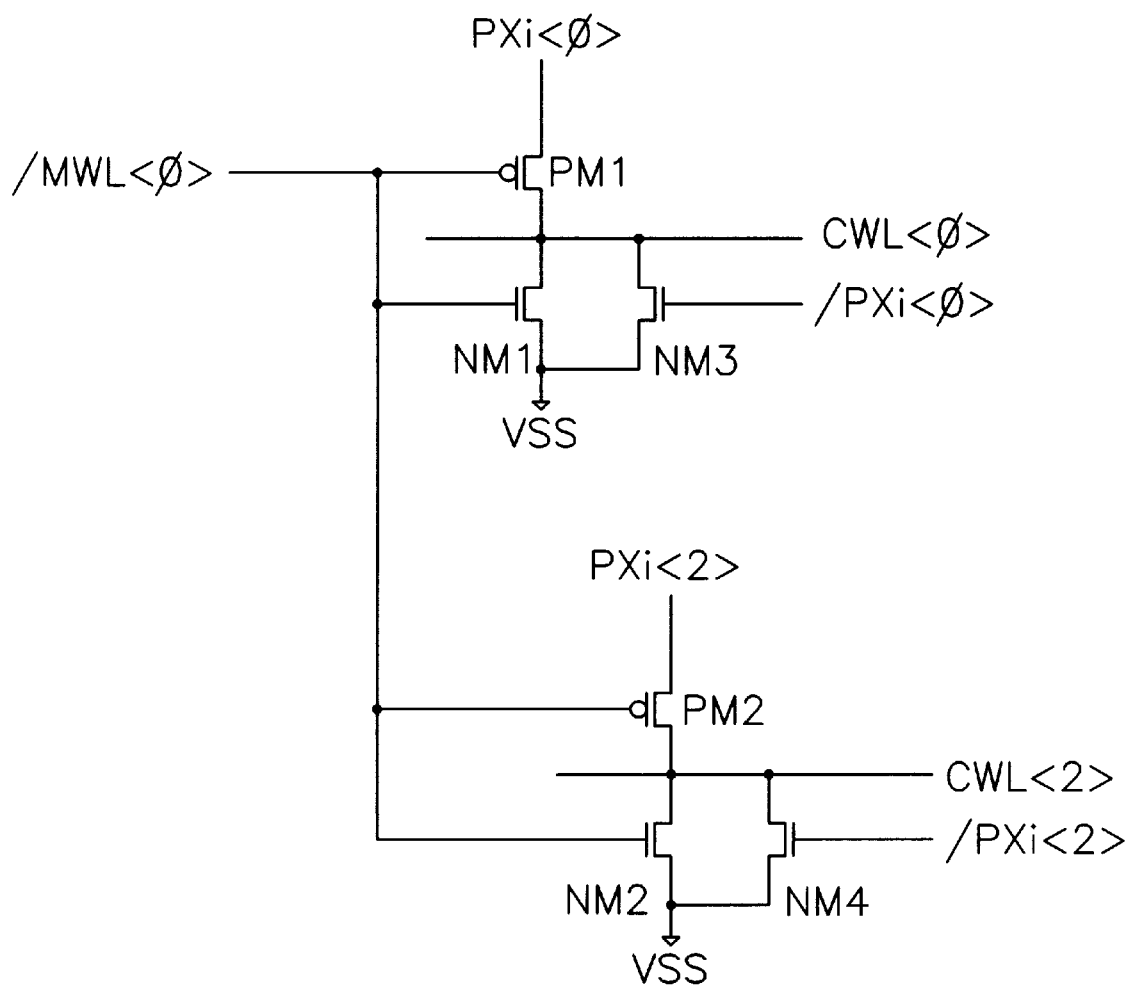
FIG. 3 is a circuit diagram illustrating a sub-word line driver in the output line arrangement structure of the row decoding array in FIG. 2.

As depicted in FIG. 3, each of the plurality of sub-word line drivers 23 includes: PMOS transistors PM1, PM2 controlled according to an output signal /MWL<0> from the main row decoder 24, for supplying a predetermined decoded word line enable signal (high voltage) Pxi<0> respectively to final word lines CWL<0>, CWL<2>; NMOS transistors NM1, NM2 controlled according to the output signal /MWL<0> from the main row decoder 24, for pulling down the voltage applied to the final word lines CWL<0>, CWL<2>, respectively; and NMOS transistors NM3, NM4 controlled according to word line disable signals /Pxi<0>, /Pxi<2>, for pulling down the voltage applied to the final word lines CWL<0>, CWL<2>, respectively. Here, the adjacent sub-word line drivers 23 apply different decoded word line enable signals Pxi to the final word line CWL.

The lines (buses) are arranged so that the word line enable signal Pxi controlled according to an output signal mwlb<0> from the main row decoder 21, and decoded in the word line driver 27 can be inputted to the sub-word line driver 23 through the bit line divider 28 or the unit bit sense amp 26, and drive the final word line CWL.

In addition, in order to drive the final word line CWL<0> of the memory cell, when the final word line CWL<0> is enabled, the output signal /MWL<0> from the main row decoder 24 becomes a logic low level, the predetermined decoded word line enable signal Pxi<0> becomes a logic high level, the predetermined decoded word line disable signal /Pxi<0> becomes a logic low level, and thus the transistors PM1, NM1, NM2 of the sub-word line driver 23 apply a high level signal to the final word line CWL<0>. When the final word line CWL<0> is disabled, the output signal /MWL<0> from the main row decoder 21 becomes a logic high level, the predetermined decoded word line enable signal Pxi<0> becomes a logic low level, the predetermined decoded word line disable signal /Pxi<0> becomes a logic high level, and thus the transistors PM1, NM1, NM2 apply the logic low level to the final word line CWL<0>, thereby clearing the memory cell.

Especially, in the preferred embodiment of the present invention, the predetermined decoded word line enable signal of the lines 25 transmitting the output signal from the main row decoding array is arranged to control the two unit memory arrays 22, thereby reducing a load to a half and decreasing a delay. A part of the output lines 25 of the main row decoding array is arranged at one side end portion of the memory array 22, and another part is arranged at a middle portion of the memory array 22 (bit line divider 28), thereby reducing an area corresponding to a line pitch positioned on the bit line divider 28 among the output lines 25 of the row decoding array. At this time, the unit memory array 22, the bit line divider 28, the unit memory array 22 and the unit bit sense amp 26 are repeatedly arrayed in the semiconductor memory device. As the memory increasingly has a large capacity, the area reduction effect may be maximized.

As described above, the output signal arrangement structure of the row decoding array in accordance with the present invention can decrease an area when arranging the memory array, and can implement a high speed operation according to load reduction of the word line control signal, by arranging the part of the output lines at one side end portion of the memory array, and another part of the output lines at the middle portion of the memory array (bit line divider), in the bus structure of word line enable and disable signals used for the row decoding array (main word line and sub-word line array constitution).

That is, one word line driver can control two unit memory arrays, thereby reducing the delay to the two times of the unit memory array word line transmission speed. Accordingly, the operation can be performed at a high speed. The part of the output lines of the row decoding array is arranged at the one side end portion of the cell array, and another part is arranged at the middle portion of the cell array (bit line divider), thereby reducing an area corresponding to a line pitch positioned on the bit line divider among the output lines of the row decoding array.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. In a unit memory array consisting of a plurality of memory cells, an output line arrangement structure of a row decoding array wherein a part of output lines of the row decoding array controls a unit memory array sub-word line driver at upper and lower ends through a bit line divider, and another part thereof controls a unit memory array sub-word line driver through one side end unit bit sense amp, thereby selecting a final word line.

2. The output line arrangement structure of the row decoding array according to claim 1 wherein an output line of the row decoding array controls at least two unit memory arrays.

* * * * *